United States Patent
Kobayashi

(10) Patent No.: US 6,734,083 B2
(45) Date of Patent: May 11, 2004

(54) DICING METHOD AND DICING APPARATUS FOR DICING PLATE-LIKE WORKPIECE

(75) Inventor: Kazuo Kobayashi, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 10/175,677

(22) Filed: Jun. 20, 2002

(65) Prior Publication Data

US 2003/0045031 A1 Mar. 6, 2003

(30) Foreign Application Priority Data

Aug. 28, 2001 (JP) ........................................ 2001-258159
Feb. 15, 2002 (JP) ........................................ 2002-038032

(51) Int. Cl.$^7$ ........................................... H01L 21/301
(52) U.S. Cl. ...................... 438/462; 438/463; 438/940; 219/121.67
(58) Field of Search .................. 438/113, 114, 438/460, 940, 462, 463; 408/22, 701; 219/121.67

(56) References Cited

U.S. PATENT DOCUMENTS

| | | | | |
|---|---|---|---|---|
| 4,610,079 A | * | 9/1986 | Abe et al. ................... | 438/462 |
| 5,543,365 A | * | 8/1996 | Wills et al. ................. | 438/462 |
| 6,211,488 B1 | * | 4/2001 | Hoekstra et al. ........ | 219/121.72 |
| 6,252,197 B1 | | 6/2001 | Hoekstra et al. | |
| 6,271,102 B1 | | 8/2001 | Brouillette et al. | |
| 6,407,360 B1 | * | 6/2002 | Choo et al. ............ | 219/121.67 |
| 6,512,196 B1 | * | 1/2003 | Yoon et al. ............ | 219/121.67 |
| 2001/0040152 A1 | * | 11/2001 | Higashi et al. ........ | 219/121.72 |
| 2002/0115235 A1 | * | 8/2002 | Sawada ...................... | 438/113 |

FOREIGN PATENT DOCUMENTS

| | | |
|---|---|---|
| JP | 63-293939 | 11/1988 |
| JP | 10-64853 A | 3/1998 |
| JP | 11-162886 A | 6/1999 |
| JP | 11-162887 A | 6/1999 |
| JP | 2000-61677 A | * 2/2000 .......... B23K/26/00 |
| WO | WO 99/48137 | 9/1999 |

OTHER PUBLICATIONS

Shigenori Naito, "Method for Manufacturing Semiconductor Integrated Circuit Device," English Translation of Published Japanese Application JP 63–293939–A, Nov., 1988.*
F. Wagner et al., "Water Games: Water Jet–Guided Laser Light Processes for Sensitive Materials," English Translation of Article Appearing in Laser–Praxis, Jun. 2001, pp. 22–24.*
Search Report of EP 02 25 4316.9–2302, dated Dec. 13, 2002.
Patent Abstract of Japan, Publication No. 63293939, Published on Nov. 30, 1988, in the name of Hitachi VLSI Eng Corp.
F. Wagner et al., "Wasserspiele Wasserstrahlgeführtes Laserlicht bearbeitet empfindliche Materialien" Laser–Praxis, Carl Hanser Verlag, No. 2, Jun. 2001, pp. 22–24, Munich, Germany, XP–001053824.

* cited by examiner

*Primary Examiner*—Erik J. Kielin
*Assistant Examiner*—Stephen W. Smoot
(74) *Attorney, Agent, or Firm*—Christie, Parker & Hale, LLP

(57) ABSTRACT

Provision is made of a dicing apparatus, for dicing a plate-like workpiece, comprising a disk-like blade which rotates to form a groove in one surface of the workpiece; a water discharging portion which discharges water toward a bottom of the groove of the one surface of the workpiece to form a stream of water; and a laser light irradiating portion which irradiates a laser light in the stream of water and impinges the laser light onto the bottom of the groove while reflecting the laser light by an inner wall of the stream of water to remove the portion of the workpiece extending from the bottom of the groove to the other surface of the workpiece, so as to dice the workpiece.

8 Claims, 6 Drawing Sheets

US 6,734,083 B2

DICING METHOD AND DICING APPARATUS FOR DICING PLATE-LIKE WORKPIECE

CROSS-REFERENCE TO RELATED APPLICATION

This application claims priority of Japanese Patent Application No. 2001-258159, filed on Aug. 28, 2001, and Japanese Patent Application No. 2002-038032, filed on Feb. 15, 2002.

BACKGROUND OF THE INVENTION

1. Field of the Invention

The present invention relates to a dicing method and a dicing apparatus. More particularly, the present invention relates to a dicing method and a dicing apparatus for cutting a comparatively thick substrate.

2. Description of the Related Art

In the semiconductor manufacturing field, a dicing process for cutting a substrate, for example, a silicon wafer, on which a plurality of semiconductor devices are formed, into small dices, i.e., for dicing a substrate, is indispensable. A dicing apparatus to carry out the dicing has a disk-like blade which is rotated to cut the substrate. Abrasive grains are adhered to an outer peripheral surface of the blade of the dicing apparatus, so that a side face of a cut substrate is sometimes roughly machined due to the abrasive grains. It is possible to cut the substrate by laser light in order to make the side face of the cut substrate comparatively smooth. However, in this case, the side face of the substrate is heated and burned, and a fracture layer in machining is sometimes formed on the side face.

In order to overcome these drawbacks, it is requited that the substrate be cut using a laser light which is passed within a stream of water and is reflected by an inner wall of the stream of water, so that the laser light is impinged upon the substrate.

Nevertheless, a cutting method in which the substrate is cut by irradiating the laser light passing within a stream of water toward the substrate while reflecting the same by an inner wall of the stream of water (hereinafter called a "laser light-water-jet-method") can be applied only to a comparatively thin material, for example, a material having a thickness less than about 30 micrometers, because of the power of the laser light. A substrate generally adopted in the semiconductor industry, for example, a silicon wafer has a thickness of approximately 700 micrometers. Thus, it is difficult to cut the substrate having such thickness by a cutting method in which the laser light is passed within the stream of water.

Therefore, the object of the present invention is to provide a dicing method and dicing apparatus for cutting i.e., dicing, a comparatively thick material, for example, a material having a thickness of about 700 micrometers, by the laser light-water-jet-method, without roughly machining and burning the side face.

SUMMARY OF THE INVENTION

In an embodiment of the present invention, in a dicing method for dicing a plate-like workpiece, provision is made of a dicing method for dicing a plate-like workpiece, comprising the steps of rotating a disk-like blade to form a groove in one surface of the workpiece; discharging water through a water discharging portion, toward a bottom of the groove of the one surface of the workpiece to form a stream of water; and removing the portion of the workpiece extending from the bottom of the groove to the other surface of the workpiece, by laser light which is irradiated from a laser light irradiating portion, in the stream of water, and is reflected by an inner wall of the stream of water, and is impinged upon the bottom of the groove to dice the workpiece.

Namely, according to an embodiment of the present invention, a groove is formed, in advance, in the comparatively thick material, so that the material can be machined by the laser light-water-jet-method. The laser light is spread only within a cross section of the stream of water, so that the power of laser light can be reduced, and the cut substrate can be prevented from being scattered. Thus, the possibility in which a burn, a burr and a fracture layer in machining are produced on a cut face, i.e., a diced face, can be reduced.

In another embodiment of the present invention, in a dicing apparatus for dicing the plate-like material, provision is made of a dicing apparatus for dicing a plate-like workpiece, comprising a disk-like blade which rotates to form a groove in one surface of the workpiece; a water discharging portion which discharges water toward a bottom of the groove of the one surface of the workpiece to form a stream of water; and a laser light irradiating portion which irradiates a laser light in the stream of water and impinges the laser light onto the bottom of the groove while reflecting the laser light by an inner wall of the stream of water to remove the portion of the workpiece extending from the bottom of the groove to the other surface of the workpiece, so as to dice the workpiece.

Namely, according to another embodiment of the present invention, a groove is formed, in advance, in the comparatively thick material, so that the material can be machined by the laser light-water-jet-method. The laser light is spread only within a cross section of the stream of water, so that the power of the laser light can be reduced, and the cut substrate can be prevented from being scattered. Thus, the possibility in which a burn, a burr and a fracture layer in machining are produced on a cut face, i.e., a diced face, can be reduced.

In another embodiment of the present invention, in a dicing method for dicing the plate-like workpiece, provision is made of a dicing method for dicing a plate-like workpiece, comprising the steps of rotating a disk-like blade to form a groove in one surface of the workpiece; discharging water through a water discharging portion, toward a bottom of the groove of the one surface of the workpiece to form a stream of water; and removing the portion of the workpiece extending from the bottom of the groove to the other surface of the workpiece, by a laser light which is irradiated from a laser light irradiating portion, in the stream of water and is reflected by an inner wall of the stream of water and is impinged upon the bottom of the groove to dice the workpiece.

Namely, according to another embodiment of the present invention, a groove is formed, in advance, in the comparatively thick material, so that the material can be machined by the laser light-water-jet-method. The laser light is scarcely spread, so that the power of laser light can be reduced, and the cut substrate can be prevented from being scattered. Thus, the possibility in which a burn, a burr and a fracture layer in machining are produced on a cut face, i.e., a diced face can be reduced.

In another embodiment of the present invention, in a dicing apparatus for dicing a plate-like workpiece, provision is made of a dicing apparatus for dicing a plate-like workpiece, comprising a disk-like blade which rotates to form a groove in one surface of the workpiece; a water discharging portion which discharges water toward a bottom of the groove of the one surface of the workpiece to form a stream of water; and a laser light irradiating portion which irradiates a laser light in the stream of water and impinges the laser light onto the bottom of the groove while reflecting the laser light by an inner wall of the stream of water to remove the portion of the workpiece extending from the bottom of the groove to the other surface of the workpiece, so as to dice the workpiece.

Namely, according to another embodiment of the present invention, a groove is formed, in advance, in the comparatively thick material, so that the material can be machined by the laser light-water-jet-method. The laser light is scarcely spread, so that the power of laser light can be reduced, and the cut substrate can be prevented from being scattered. Thus, the possibility in which a burn, a burr and a fracture layer in machining are produced on a cut face, i.e., a diced face, can be reduced.

These and other objects, features and advantages of the present invention will be more apparent in light of the detailed description of exemplary embodiments thereof as illustrated by the drawings.

BRIEF DESCRIPTION OF THE DRAWING

The present invention will be more clearly understood from the description as set below with reference to the accompanying drawings, wherein:

FIG. 6b is a view taken along the line A—A in FIG. 6a.

DESCRIPTION OF THE PREFERRED EMBODIMENTS

Figure 1A:
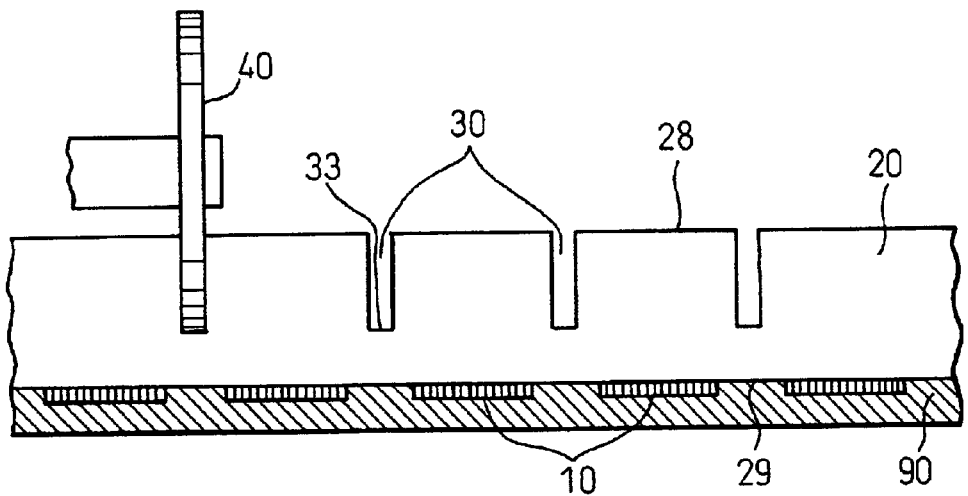
FIG. 1a is a view for explaining a dicing method according to the present invention, in which the dicing is carried out.

Embodiments of the present invention will be described below with reference to the drawings. In the drawings, the same members are designated by the same reference numerals. The scale of the drawings is changed to allow easy understanding.

Figure 1B:
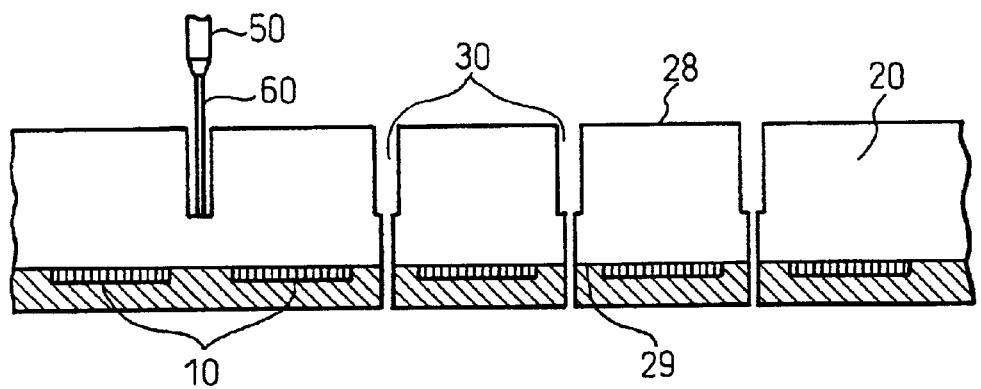
FIG. 1b is a view for explaining a dicing method according to the present invention, in which a stream of water is formed.
Figure 1C:
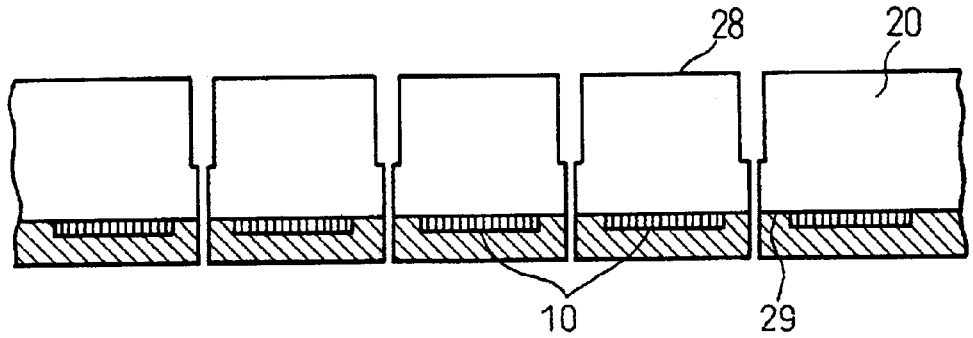
FIG. 1c is a view for explaining a dicing method according to the present invention, in which a substrate is cut.

FIG. 1a to FIG. 1c is a view explaining a dicing method according to the present invention. A plurality of semiconductor devices 10 are formed on a surface (a pattern forming surface) 29 of a substrate 20. These semiconductor devices 10 are arrayed and equally spaced one another. The thickness of the substrate 20 in this embodiment is about 700 micrometers.

The dicing apparatus according to the present invention has a disk-like blade 40. Abrasive grains are adhered to an outer peripheral surface of the disk-like blade 40. The disk-like blade 40 is controllably driven by an appropriate motor coupled to the blade 40. As shown in FIG. 1a, a groove 30 is formed in one surface of the substrate 20, for example, an underside 28 by the disk-like blade 40 contained in the dicing apparatus according to the present invention. As can be seen from the drawing, a plurality of grooves 30 are formed between semiconductor devices 10. After the grooves 30 are formed, a distance between a pattern-forming surface 29 and a bottom 33 of the groove 30 becomes small enough to cut the portion therebetween by laser light passing in a stream of water as described hereinafter.

As shown in FIG. 1b, the dicing apparatus according to the present invention has a water discharging portion 50, for example, a nozzle, which is connected to an appropriate water source (not shown). As shown in FIG. 1b, water, for example, pure water is discharged from an end of the water discharging portion 50 to the bottom 33 of the groove 30. The water is discharged so that a stream of water or a jet of water 60 is formed from the end of the water discharging portion 50 to the bottom 33 of the groove 30. It is preferable that the outer diameter of the stream of water 60 is similar to the internal diameter of the end of the water discharging portion 50 in the vicinity of the end of the water discharging portion 50 and the bottom 33 of the groove 30. Therefore, in this case, it is required that the flow rate and the pressure of the discharged water and the internal diameter of the end of the water discharging portion is selected to maintain the outer diameter of the stream of water 60 between the vicinity of the end of the water discharging portion 50 and the vicinity of the bottom 33 of the groove 30.

Figure 3:
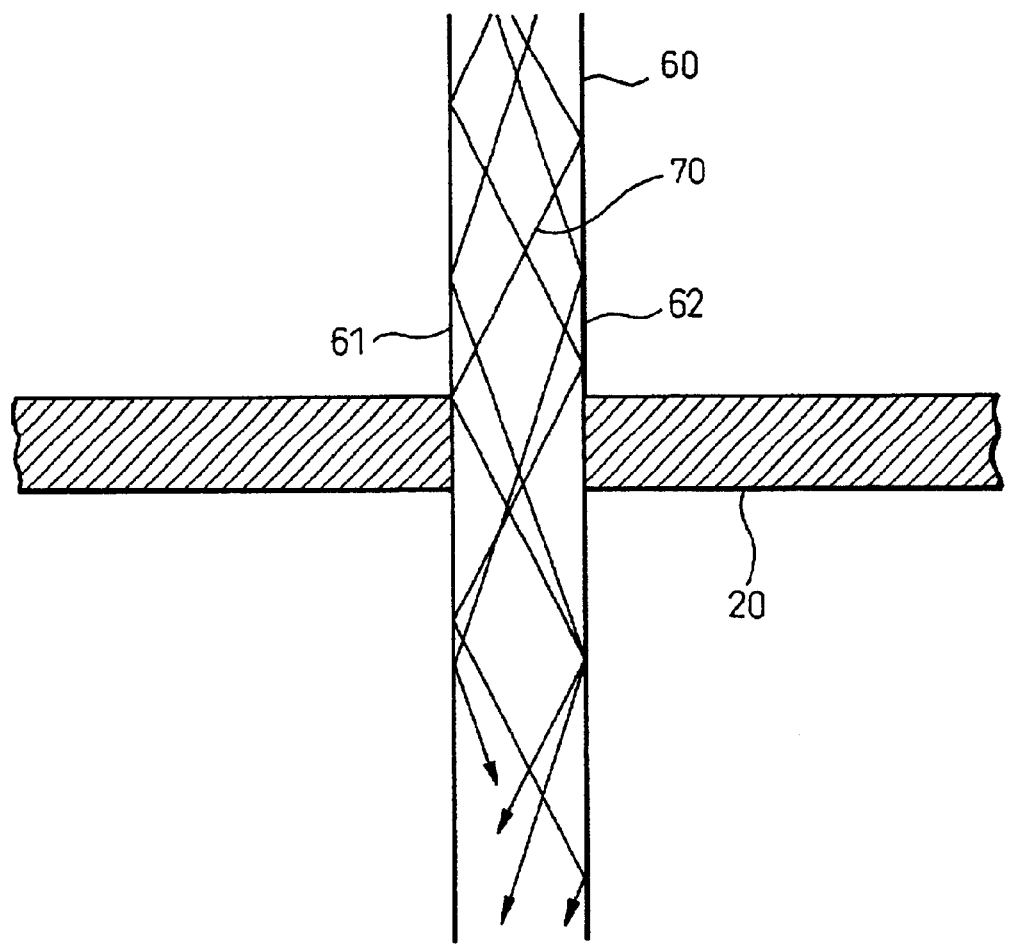
FIG. 3 is an enlarged conceptual illustration in which a concept of a dicing operation according to an embodiment of the present invention is enlarged.

FIG. 3 is an enlarged conceptual illustration in which the concept of a dicing work according to an embodiment of the present invention is shown. The dicing apparatus according to the present invention has a laser light irradiating device (not shown) in the vicinity of the water discharging portion 50. The laser light irradiating device irradiates a laser light which passes in the stream of water, in generally parallel to the stream of water 60 shown in FIG. 1b, in the vicinity of the end of the water discharging portion 50. As shown in FIG. 3, a laser light 70 which is reflected by internal walls 61, 62, i.e., boundary surfaces between water and air, passes in the stream of water 60, toward the bottom 33 of the groove 30. Namely, the stream of water 60 functions as an optical fiber to reliably guide the laser light 70 to the bottom of the groove 30. The laser light irradiated from the laser light irradiating device moves within a cross section of the stream of water 60, for example, within a diameter of about 100 micrometers in this embodiment, toward the bottom 33 of the groove 30, and impinges on the bottom 33 of the groove 30. Thus, as shown in FIG. 1c, the laser light passes through the bottom 33 to remove the portion of the substrate 20 extending from the bottom 33 of the groove 30 to the pattern-forming surface 29. Therefore, the substrate 20 can be diced into individual semiconductor devices.

As described above, in this embodiment, the groove 30 is formed, in advance, in the comparatively thick material, i.e., the substrate 20. Therefore, the material can be machined by the laser light-water-jet-method. In the laser light-water-jet-method, water is continuously discharged, so that a part of the substrate 20 removed by the laser light can be prevented from being scattered. The side portion of the substrate 20 is not extremely heated because the substrate 20 is cooled by the stream of water 60. Therefore, the side portion of the formed semiconductor device is prevented from being deformed by heat, and from producing a burn, a burr and a fracture layer in machining thereon. As a result, the power of the laser light can be reduced. The laser light is guided within the stream of water 60 and is not spread. Therefore, the power of the laser light can be restricted, and the spot to which the laser light is irradiated is smaller than that without using the stream of water.

Figure 2A:
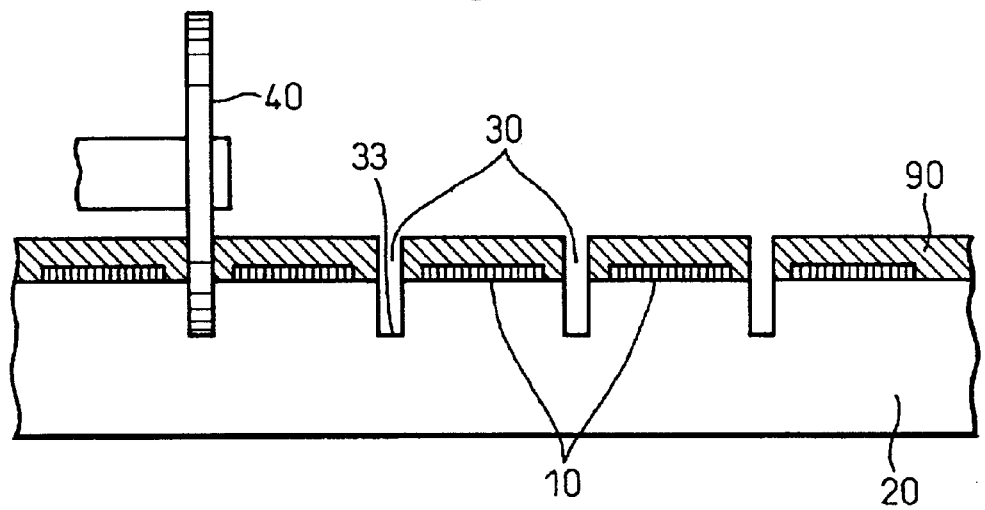
FIG. 2a is a view for explaining another dicing method according to the present invention, in which the dicing is carried out.
Figure 2B:
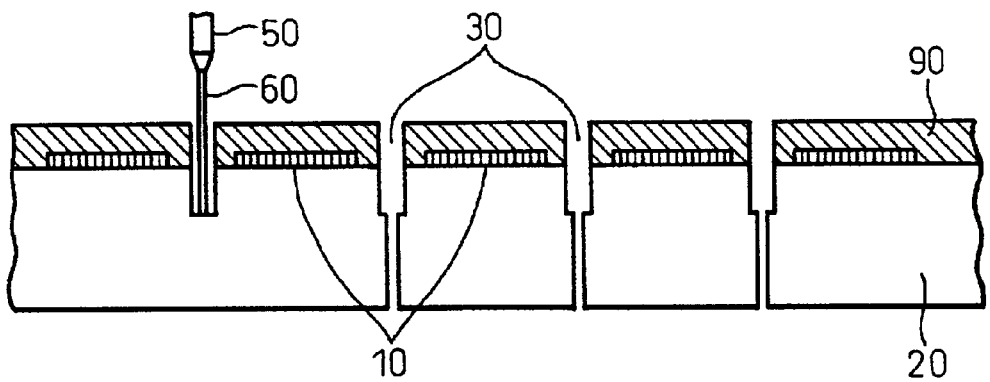
FIG. 2b is a view for explaining another dicing method according to the present invention, in which a stream of water is formed.
Figure 2C:
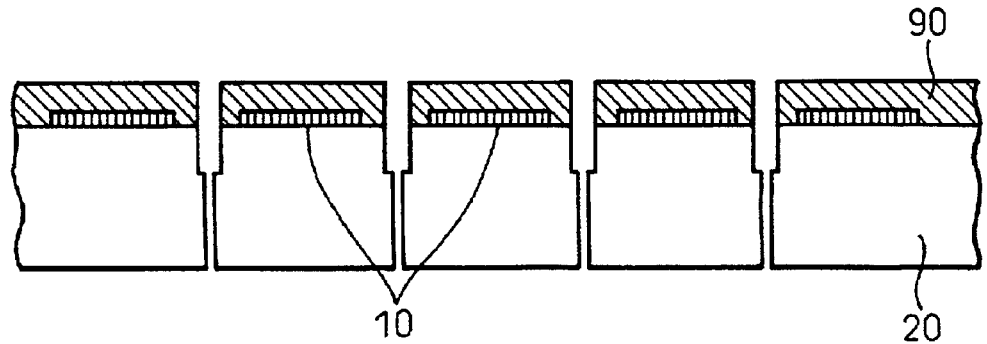
FIG. 2c is a view for explaining another dicing method according to the present invention, in which a substrate is cut.

As shown in FIG. 1a to FIG. 1c, a protective film 90 is adhered to the pattern-forming surface 29 of the substrate 20. The protective film 90 is, for example, a film in which a liquid resin is coated and hardened or a resin film, and protects the semiconductor device 10 in various kinds of manufacturing processes. As shown in FIG. 1a to FIG. 1c, if the protective film 90 is colored, the protective film 90 can be removed together with the bottom 33 of the groove 30 by the laser light passing in the stream of water 60. If the protective film 90 is transparent, the protective film 90 cannot be removed by the laser light. However, the protective film 90 can be removed by the stream of water 60 itself. Namely, both of the colored and the transparent protective films 90 can be removed by use of the dicing apparatus according to the present invention. If the protective film 90 is transparent, as shown in FIG. 2a, it is also possible to dice the substrate 20 at the side adjacent to the pattern-forming surface 29 thereof. Thus, the transparent protective film 90 can be cut, in advance, by dicing. In this case, as shown in FIGS. 2b and 2c, the substrate 20 is cut by the laser light passing in the stream of water 60.

In another embodiment of the present invention, the dicing apparatus has at least two disk-like blades 40. Similar to the above-described embodiment, these disk-like blades 40 are respectively connected to respective motors and are independently and controllably driven. In this embodiment, the number identical to the number of the disk-like blade 40, i.e., two water discharging portions 50 and two laser light irradiating devices are provided. In this case, immediately after the groove 30 is formed by the disk-like blade 40, the dicing can be carried out by the water discharging portion 50 and the laser light irradiating portion (not shown). Namely, while the dicing is carried out by the water discharging portion 50 and the laser light irradiating portion, the disk-like blade 40 can form an adjacent groove. Therefore, the time required for cutting, i.e., dicing can be further reduced.

Figure 4:
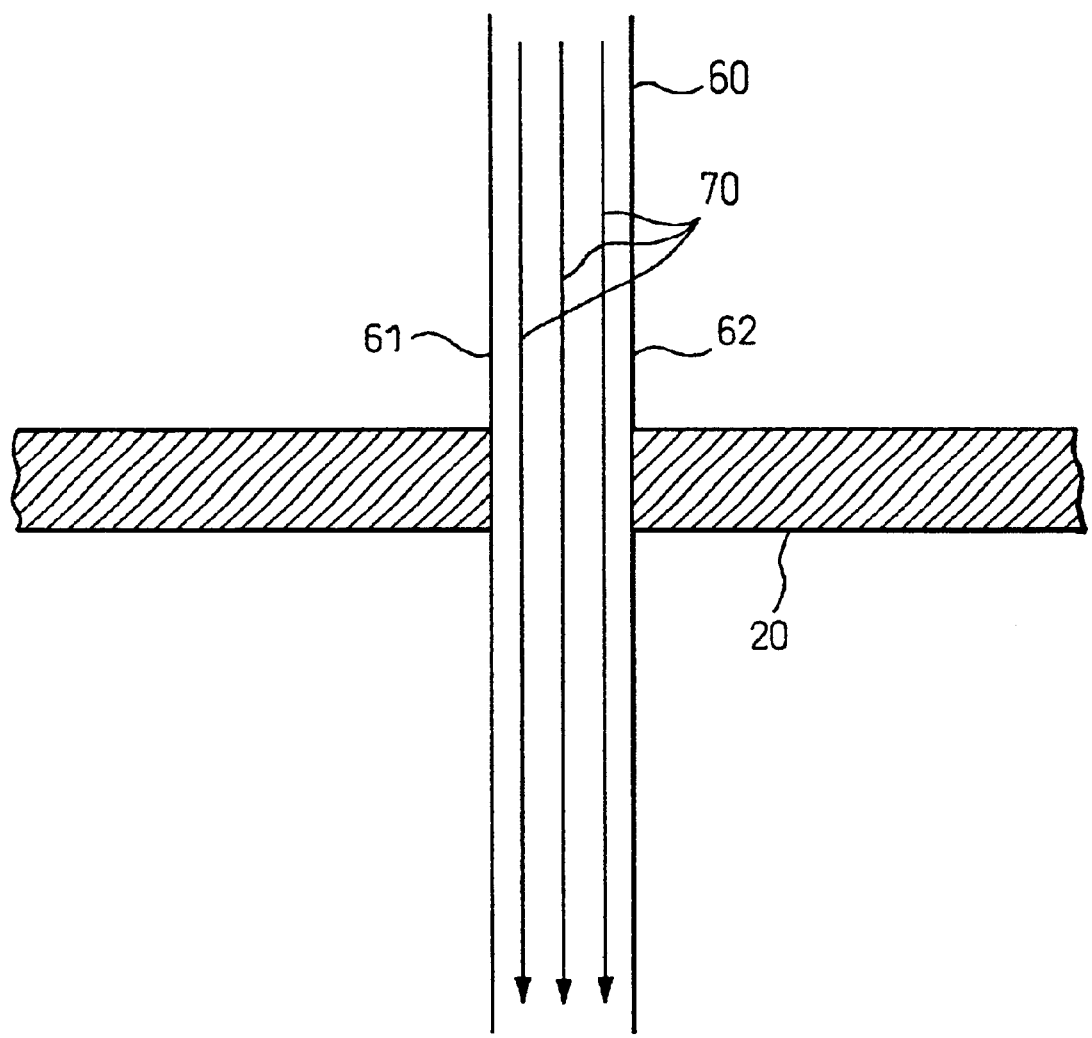
FIG. 4 is an enlarged conceptual illustration in which a concept of a dicing operation according to another embodiment of the present invention is enlarged.

FIG. 4 is an enlarged conceptual illustration in which a concept of a dicing operation according to another embodiment of the present invention is enlarged. In this embodiment, the laser light 70 passes, around the center of the stream of water 60, substantially parallel to the stream of water 60. Therefore, in this embodiment, in addition to an effect obtained in the above-described embodiment, an effect can be obtained in which the laser light 70 is not reflected by the inner wall of the stream of water 60, so that the power of laser light can be reduced, and thus resulting in a low loss of energy. Namely, in this embodiment, the groove is formed, in advance, in the comparatively thick material, so that the material can be machined by the laser light-water-jet-method. The laser light is scarcely spread in the stream of water. Therefore, the power of laser light can be reduced, and the cut substrate can be prevented from being scattered. Thus, the possibility of a burn, a burr and a fracture layer in machining, on a cut face, i.e., a diced face, can be reduced.

Figure 5:
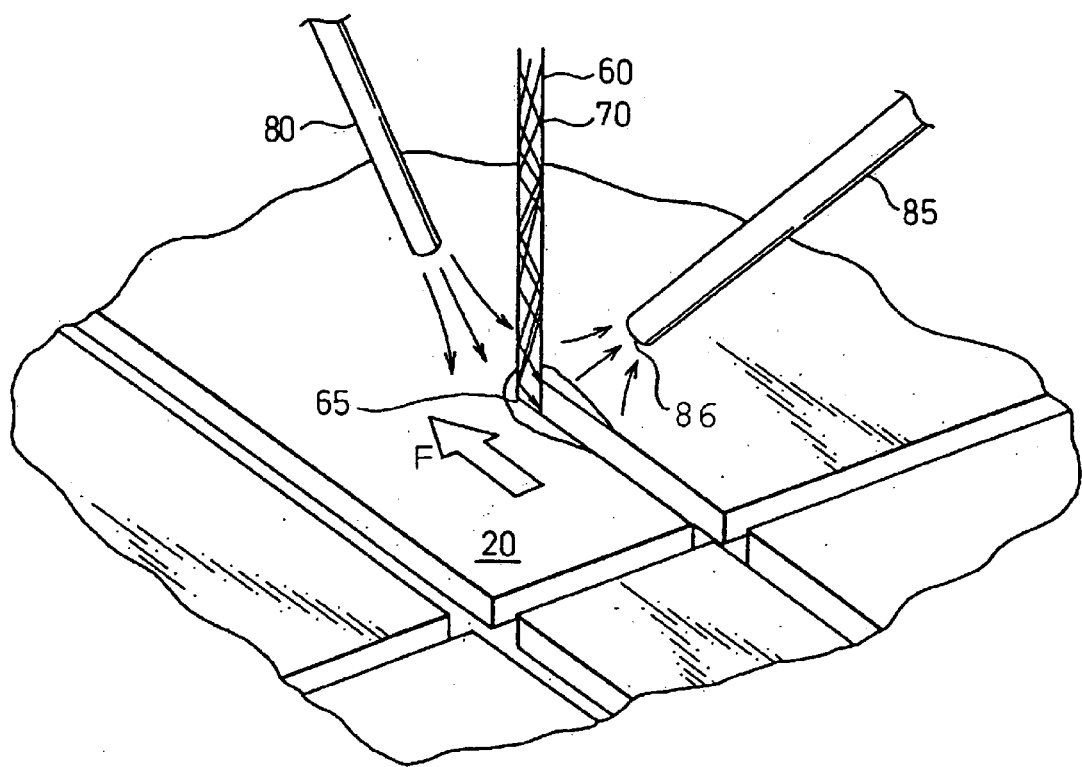
FIG. 5 is a perspective view in which a dicing operation according to yet another embodiment of the present invention is shown.
Figure 6A:
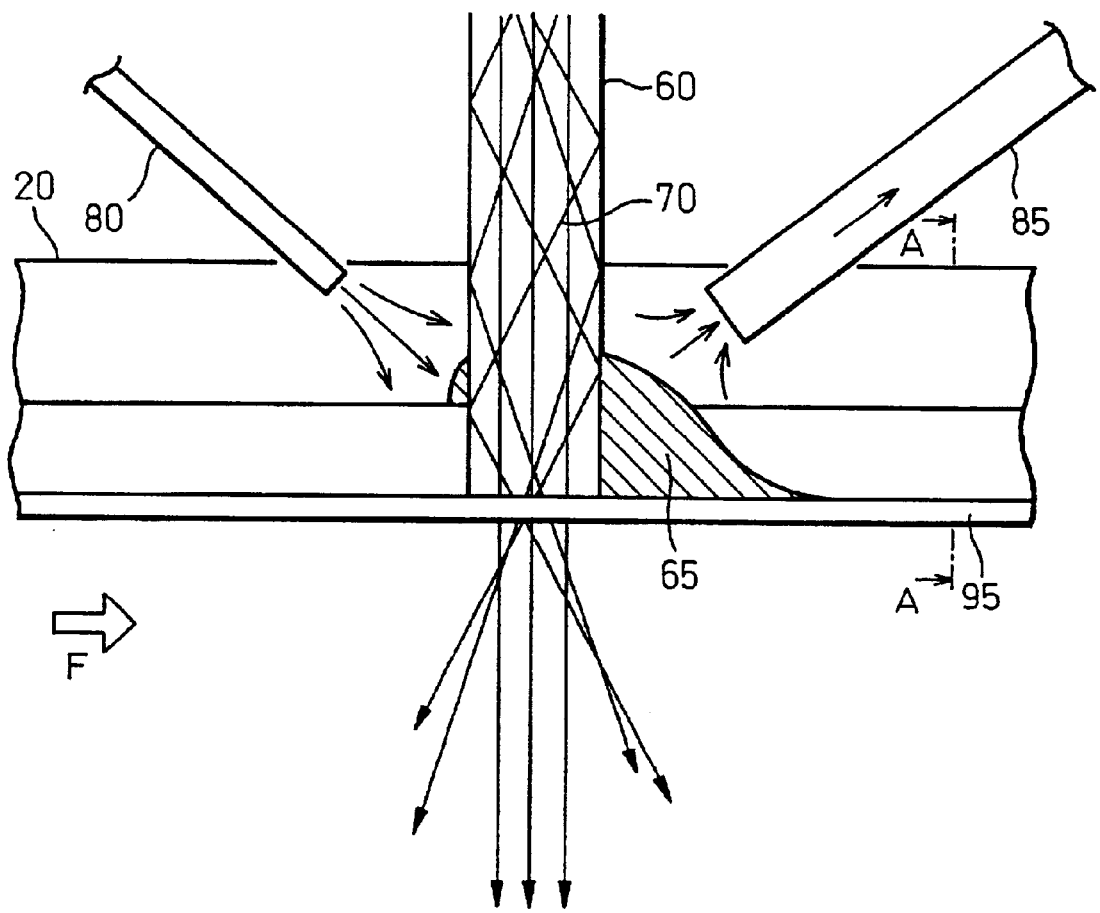
FIG. 6a is an enlarged conceptual illustration in which a dicing work according to yet another embodiment of the present invention is enlarged.
Figure 6B:
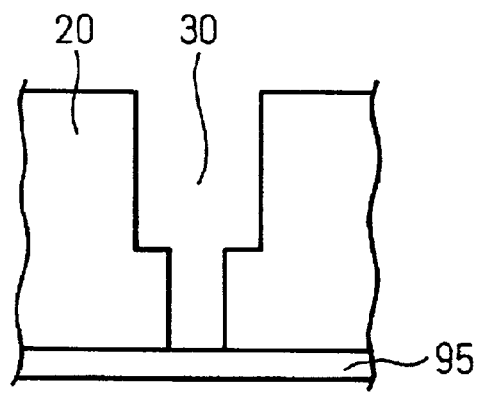

FIG. 5 is a perspective view in which a dicing operation according to yet another embodiment of the present invention is shown. In this embodiment, a suction member 85 is shown, and a suction port 86 of the suction member 85 is located adjacent to the portion of the substrate 20 in which the stream of water 60 comes into collision. In this embodiment, the substrate 20 is secured on a transparent securing film 95. FIG. 6a is an enlarged conceptual illustration in which a dicing operation according to yet another embodiment of the present invention is enlarged. FIG. 6b is a view taken along the line A—A in FIG. 6a. In operation some of the fragments of the substrate 20, which are produced by irradiation of laser light, are scattered like sparks from a water accumulation or pool 65. As shown in FIG. 6a, the substrate 20 can be moved in a direction F, so that the substrate 20 can be cut. As a matter of course, the stream of water 60 including the laser light and the substrate 20 may be mutually and relatively moved. There is a possibility that such fragments are dropped onto the substrate 20 to be secured to its position by oxidation. In this case, it is difficult to remove fragments from the substrate even by washing the substrate, and the semiconductor device on which fragments are secured becomes defective. However, in this embodiment, such fragments can be sucked by the suction member 85. Therefore, the semiconductor device can be prevented from becoming defective in relation to fragments secured thereon. Any shape can be adopted for the suction member. An aspirator may be adopted as a suction member. In this case, fragments can be relatively easily sucked. When the substrate 20 or the stream of water 60 including the laser light is moved, it is preferable that the suction member is positioned forward of a moving direction. In this case, as there is a possibility that fragments are forwardly scattered in the moving direction, the effect of sucking can be improved.

In FIG. 5 and FIG. 6a, a gas supplying portion 80, to supply gas through the end thereof, is shown. The gases supplied from the gas supplying portion 80 include an inert gas, for example, nitrogen. As shown in FIG. 6a, the gas supplied from the gas supplying portion 80 is supplied to the vicinity of the portion of the substrate 20 in which the stream of water 60 comes into collision, and is backwardly supplied in the moving direction F. The stream of water 60 comes into collision with the substrate 20, so that a water accumulation 65 is formed around the collision portion, on the substrate 20 and the securing film 95. The laser light is scattered and diffused due to such water accumulation 65 in the vicinity of the cut portion. Accordingly, the ability of machining may be extremely reduced. However, in this embodiment, gas is supplied as described above, so that the water accumulation 65 is not formed at the rear of the direction F, on the substrate 20. Therefore, the ability of machining can be prevented from being extremely reduced due to the laser light being scattered or diffused around the cut portion. Fragments can be orientated, by supplying gas, to flow toward the suction member. Therefore, the flowing fragments can be prevented from being secured to the substrate 20. Accordingly, the supplying of gas from the gas supplying portion 80 is also effective when the substrate or the stream of water including the laser light is stopped. As a matter of course, in this embodiment, the laser light 70 may be passed around the center of the stream of water 60, substantially parallel to the stream of water 60.

In the above-described embodiment, the groove 30 is formed in the underside 28 of the substrate 20 by the disk-like blade 40. Accordingly, the side portion of the substrate 20 on the side of the semiconductor device 10 can be made smoother after the substrate 20 is divided into plural semiconductor devices. However, forming the groove in the pattern-forming surface 29 of the substrate 20 and to carry out the dicing on both sides of the substrate 20 by opposing two pairs of water discharging portions 50 and the laser light irradiating devices, each having one water discharging portion 50 and one laser light irradiating device, on opposite sides of the substrate 20, is included in the scope of the present invention.

According to the present invention, a common effect can be obtained in which the groove is formed, in advance, in the comparatively thick material, so that the material can be machined by the laser light-water-jet-method. Additionally, can be obtained a common effect in which the laser light-water-jet-method is adopted so that the power of the laser light can be reduced, the cut substrate can be prevented from being scattered, and the possibility that a burn, a burr and a fracture layer in machining are produced on a cut face, i.e., a diced face, can be reduced.

Moreover, according to the present invention, an effect can be obtained in which the groove is formed, in advance, in the comparatively thick material so that the material can be machined by the laser light-water-jet-method, and the laser light in the stream of water is scarcely scattered, so that the power of laser light can be reduced, the cut substrate can be prevented from being scattered, and the possibility that a burn, a burr and a fracture layer in machining are produced on a cut face, i.e., a diced face, can be reduced.

Although the invention has been shown and described with exemplary embodiments thereof, it should be understood by those skilled in the art that the foregoing and various other changes, omissions and additions may be made therein and thereto without departing from the spirit and the scope of the invention.

What is claimed is:

1. A dicing method for dicing a plate-like workpiece, comprising the steps of:
   rotating a disk-like blade to form a groove on one surface of the workpiece;
   discharging water through a water discharging portion to form a stream of water that extends toward a bottom of the groove of the one surface of the workpiece;
   removing the portion of the workpiece extending from the bottom of the groove to the other surface of the workpiece by irradiating a laser light from a laser light irradiating portion into the stream of water toward the bottom of the groove to dice the workpiece; and
   sucking fragments of the workpiece that are produced by the irradiation of the laser light by a suction portion provided adjacent to the portion of the workpiece with which the stream of water comes into collision.

2. A dicing method according to claim 1, further comprising the step of supplying gas toward the collision portion by use of a gas supplying portion provided on the one side of the workpiece and on a side opposite to the suction portion.

3. A dicing method according to claim 2, wherein a plurality of said blades, a plurality of said water discharging portions and a plurality of said laser irradiating portions are provided, such that the number of water discharging portions and laser light irradiating portions is identical to the number of disk-like blades and wherein each of the water discharging portions and each of the laser light irradiating portions is arranged corresponding to each of the disk-like blades.

4. A dicing method according to claim 1 or 2, wherein at least one said disk-like blade, at least two said water discharging portions and at least two said laser irradiating portions are provided, such that the number of the water discharging portions and the number of the laser light irradiating portions are each twice as many as the number of the at least one disk-like blade, and wherein pairs of the water discharging portions and the laser light irradiating portions, each having one said water discharging portion and one said laser light irradiating portion, are positioned opposed to each other on opposite sides of the workpiece, corresponding to each of the at least one disk-like blade.

5. A dicing apparatus for dicing a plate-like workpiece, comprising:
   a disk-like blade which rotates to form a groove in one surface of the workpiece;
   a water discharging portion which discharges water to form a stream of water that extends toward a bottom of the groove of the one surface of the workpiece; and
   a laser light irradiating portion which irradiates a laser light in the stream of water and impinges the laser light onto the bottom of the groove to remove the portion of the workpiece extending from the bottom of the groove to the other surface of the workpiece, so as to dice the workpiece; and
   a suction portion provided adjacent to the portion of the workpiece with which the stream of water comes into collision, into which fragments of the workpiece that are produced by the irradiation of the laser light are suctioned.

6. A dicing apparatus according to claim 5, further comprising a gas supplying portion provided on the one side of the workpiece and on a side opposite to the suction portion, wherein gas is supplied toward the collision portion.

7. A dicing apparatus according to claim 5 or 6, comprising a plurality of said disk-like blades, a plurality of said water discharging portions and a plurality of said laser irradiating portions, wherein the number of water discharging portions and laser light irradiating portions is identical to the number of disk-like blades and wherein each of the water discharging portions and each of the laser light irradiating portions is arranged corresponding to each of the disk-like plural blades.

8. A dicing apparatus according to claim 5 or 6, comprising at least one said blade, at least two said water discharging portions and at least two said laser irradiating portions, wherein the number of the water discharging portions and the number of the laser light irradiating portions are each twice as many as the number of the at least one disk-like blade, and wherein pairs of the water discharging portions and the laser light irradiating portions, each having one said water discharging portion and one said laser light irradiating portion, are positioned opposed to each other on opposite sides of the workpiece, corresponding to each of the at least one disk-like blade.

* * * * *